(12) United States Patent
Matsuoka et al.

(10) Patent No.: US 11,683,019 B2
(45) Date of Patent: Jun. 20, 2023

(54) SURFACE ACOUSTIC WAVE DEVICE

(71) Applicant: NDK SAW Devices Co., Ltd., Hokkaido (JP)

(72) Inventors: Naoto Matsuoka, Saitama (JP); Makiko Nakamura, Saitama (JP); Susumu Yoshimoto, Saitama (JP)

(73) Assignee: NDK SAW Devices Co., Ltd., Hokkaido (JP)

( * ) Notice: Subject to any disclaimer, the term of this patent is extended or adjusted under 35 U.S.C. 154(b) by 797 days.

(21) Appl. No.: 16/684,607

(22) Filed: Nov. 15, 2019

(65) Prior Publication Data
US 2020/0162052 A1 May 21, 2020

(30) Foreign Application Priority Data

Nov. 16, 2018 (JP) .............................. JP2018-215986

(51) Int. Cl.
*H03H 9/02* (2006.01)
*H03H 3/08* (2006.01)
(Continued)

(52) U.S. Cl.
CPC .......... *H03H 9/02535* (2013.01); *H03H 3/08* (2013.01); *H03H 9/1452* (2013.01);
(Continued)

(58) Field of Classification Search
CPC .... H03H 9/02535; H03H 3/08; H03H 9/1452; H03H 9/14552; H03H 9/1457;
(Continued)

(56) References Cited

U.S. PATENT DOCUMENTS 7,576,471 B1 8/2009 Solal
9,712,139 B2 7/2017 Taniguchi et al.
(Continued)

FOREIGN PATENT DOCUMENTS

JP 2003087083 3/2003
JP 2009159039 7/2009
(Continued)

OTHER PUBLICATIONS

"Office Action of Japan Counterpart Application" with English translation thereof, dated Mar. 1, 2022, p. 1-p. 12.
Office Action of Taiwan Counterpart Application, with English translation thereof, dated Dec. 2, 2021, pp. 1-15.

*Primary Examiner* — Rakesh B Patel
*Assistant Examiner* — Jorge L Salazar, Jr.
(74) *Attorney, Agent, or Firm* — JCIPRNET

(57) ABSTRACT

A surface acoustic wave device includes a piezoelectric substrate and a pair of interdigital transducer electrodes. The pair of interdigital transducer electrodes include an alternating region as a region where the electrode fingers connected to one busbar and the electrode fingers connected to the other busbar are alternately provided. When a region on an end portion side of the alternating region and a region including distal end portions of the plurality of electrode fingers is referred to as an edge region, a propagation velocity of a surface acoustic wave in the edge region is slower than a propagation velocity of a surface acoustic wave in the alternating region. A propagation velocity of a surface acoustic wave in a busbar region as a region where the busbar is disposed is faster than the propagation velocity of the surface acoustic wave in the alternating region.

14 Claims, 11 Drawing Sheets

(51) Int. Cl.
*H03H 9/145* (2006.01)
*H03H 9/25* (2006.01)

(52) U.S. Cl.
CPC ...... *H03H 9/1457* (2013.01); *H03H 9/14552* (2013.01); *H03H 9/25* (2013.01)

(58) Field of Classification Search
CPC ................ H03H 9/25; H03H 9/14532; H03H 9/02834; H03H 9/14541
USPC ........................................ 333/133, 193–196
See application file for complete search history.

(56) References Cited

U.S. PATENT DOCUMENTS

| | | | |
|---|---|---|---|
| 2002/0153970 A1* | 10/2002 | Noto | H03H 9/02559 333/195 |
| 2013/0049533 A1 | 2/2013 | Matsuda et al. | |
| 2013/0249647 A1* | 9/2013 | Nakanishi | H03H 9/02858 333/186 |
| 2019/0123713 A1* | 4/2019 | Daimon | H03H 9/02866 |

FOREIGN PATENT DOCUMENTS

| | | |
|---|---|---|
| JP | 5221616 | 6/2013 |
| JP | 5503020 | 5/2014 |
| JP | 2016184951 | 10/2016 |
| JP | 2017112603 | 6/2017 |
| WO | 2009147787 | 12/2009 |
| WO | 2018003282 | 1/2018 |

\* cited by examiner

SURFACE ACOUSTIC WAVE DEVICE

CROSS-REFERENCE TO RELATED APPLICATIONS

This application is based on and claims priority under 35 U.S.C. § 119 to Japanese Patent Application No. 2018-215986, filed on Nov. 16, 2018, and the entire content of which is incorporated herein by reference.

TECHNICAL FIELD

This disclosure relates to a surface acoustic wave device that converts a frequency signal into a surface acoustic wave.

DESCRIPTION OF THE RELATED ART

As a low-spurious surface acoustic wave device having a high Q-value, one that operates in a piston mode has been developed (for example, Japanese Patent No. 5221616 and Japanese Patent No. 5503020). The piston mode, which is one of modes of vibration of a surface acoustic wave (SAW), shows an amplitude distribution where an amplitude of the SAW is approximately constant in an excitation region while the amplitude rapidly reduces in a region on its outside, as illustrated in FIG. 1C, which will be described below.

In the excitation for the SAW, a comb-shaped electrode where multiple electrode fingers are connected to a busbar is used. The surface acoustic wave device (SAW device) includes an Interdigital Transducer (IDT) electrode where two comb-shaped electrodes are arranged opposed to one another such that the electrode fingers are alternately provided when viewed in an arranged direction of the electrode fingers. The SAW is excited by inputting a frequency signal having a predetermined frequency to one comb-shaped electrode, and then, the SAW propagates to the other comb-shaped electrode.

Techniques disclosed in Japanese Patent No. 5221616 and Japanese Patent No. 5503020 divide a region between two busbars arranged opposed to one another into five of a center region, two regions on its sides, and two regions on their sides along a direction that the busbars extend (a central region, edge regions, and gap regions in Japanese Patent No. 5221616 and a central excitation region, inner edge regions, and outer edge regions in Japanese Patent No. 5503020). The piston mode is obtained, for example, by increasing and decreasing widths of electrode fingers ("electrode portions" disclosed in Japanese Patent No. 5221616) positioned in side regions of the center. Japanese Patent No. 5221616 discloses a fact that it is necessary to ensure a gap length dimension in the gap region of around one to three acoustic wavelengths.

However, these methods have a problem that a device (an acoustic wave device in Japanese Patent No. 5221616 and an electroacoustic transducer in Japanese Patent No. 5503020) increases in size since the gap length dimension (dimensions of the gap region in Japanese Patent No. 5221616 and the outer edge region in Japanese Patent No. 5503020) is longer than that of an ordinary IDT electrode.

A need thus exists for a surface acoustic wave device which is not susceptible to the drawback mentioned above.

SUMMARY

According to an aspect of this disclosure, there is provided a surface acoustic wave device that includes a piezoelectric substrate and a pair of interdigital transducer (IDT) electrodes. The pair of IDT electrodes includes a pair of busbars provided on the piezoelectric substrate, and a plurality of electrode fingers mutually extending into a comb shape from the respective busbars toward the opposed busbars. The pair of IDT electrodes include an alternating region as a region where the electrode fingers connected to one busbar and the electrode fingers connected to the other busbar are alternately provided, when viewed along an arranged direction of the plurality of electrode fingers. When a region on an end portion side of the alternating region and a region including distal end portions of the plurality of electrode fingers is referred to as an edge region, a propagation velocity of a surface acoustic wave in the edge region is slower than a propagation velocity of a surface acoustic wave in the alternating region. A propagation velocity of a surface acoustic wave in a busbar region as a region where the busbar is disposed is faster than the propagation velocity of the surface acoustic wave in the alternating region.

BRIEF DESCRIPTION OF THE DRAWINGS

The foregoing and additional features and characteristics of this disclosure will become more apparent from the following detailed description considered with reference to the accompanying drawings.

DESCRIPTION OF EMBODIMENTS

First, a description will be given of a basic configuration for exciting a surface acoustic wave (SAW) in a piston mode in a surface acoustic wave device (SAW device) according to an embodiment by referring to FIG. 1A to FIG. 1C.

Figure 1A:
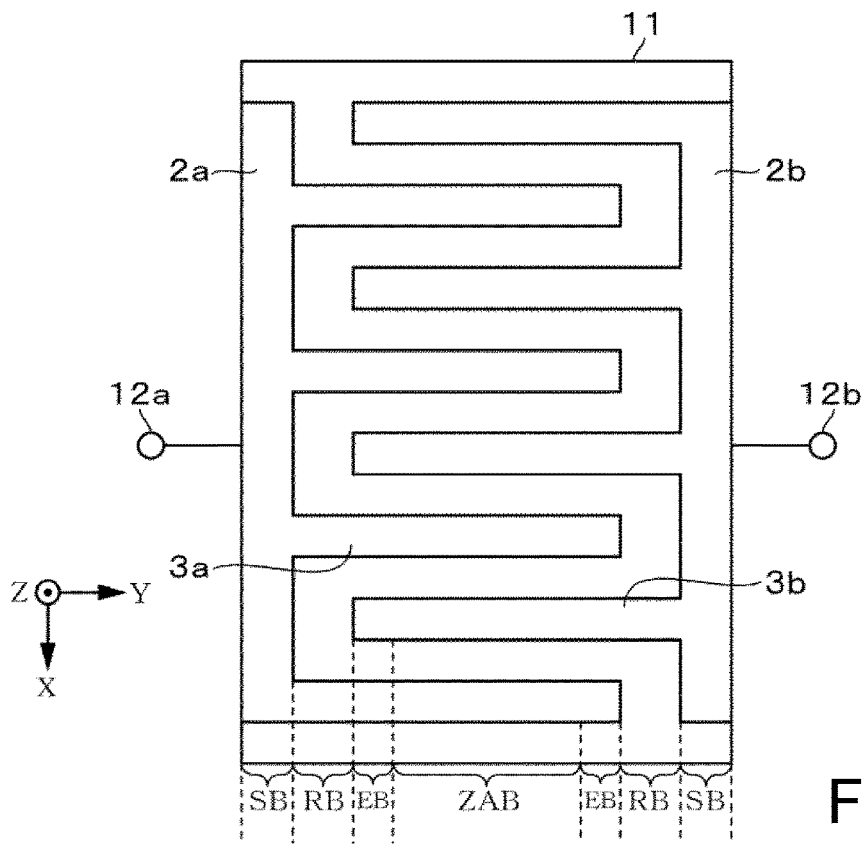
FIG. 1A to FIG. 1C are explanatory drawings illustrating a basic configuration for exciting a surface acoustic wave in a piston mode.

FIG. 1A is an enlarged plan view schematically illustrating the SAW device. FIG. 1B is a distribution diagram of a propagation velocity of the SAW viewed along a Y-axis direction illustrated in FIG. 1A. FIG. 1C is a distribution diagram of an amplitude of the SAW viewed along the identical direction.

The SAW device in this example includes an interdigital transducer (IDT) electrode formed on a rectangular piezoelectric substrate 11 that excites the SAW. In the following description, a direction along a long side of the rectangular piezoelectric substrate 11 is referred to as a longitudinal direction (an X direction in FIG. 1A), and a direction along a short side is referred to as a lateral direction (a Y direction in the identical drawing).

The IDT electrode is disposed, for example, to extend in the longitudinal direction along respective long sides of the piezoelectric substrate 11. The IDT electrode includes two busbars 2a and 2b connected to respective signal ports 12a and 12b, and a large number of electrode fingers 3a and 3b formed to extend in the lateral direction from the respective busbars 2a and 2b.

A case where, for example, lithium niobate (LiNbO$_3$), lithium tantalate (LiTaO$_3$), aluminum nitride (AlN), scandium (Sc)-doped aluminum nitride, or the like is used as a piezoelectric material that constitutes the piezoelectric substrate 11 can be exemplified.

The piezoelectric substrate 11 according to the embodiment includes (i) one where a piezoelectric thin film is formed on a surface of a substrate made of a non-piezoelectric material and (ii) a laminated substrate where a non-piezoelectric material and a piezoelectric material are laminated. As (i), a case where the piezoelectric thin film of the aluminum nitride is formed on a surface of a sapphire substrate as the non-piezoelectric material can be exemplified. As (ii), a laminated substrate where a silicon substrate as the non-piezoelectric material and a LiTaO$_3$ substrate as the piezoelectric material are laminated can be exemplified.

When the LiNbO$_3$ is used as the piezoelectric material, as a cut angle of the LiNbO$_3$ in an Euler angle ($\phi$, $\theta$, $\psi$) notation, one where $\phi$, $\psi$=0±10° and $\theta$=38±10°, one where $\phi$, $\psi$=0±10° and $\theta$=−85±15°, one where $\phi$, $\psi$=0±10° and $\theta$=131±15°, or one where $\phi$=0±10°, $\theta$=−90±10°, and $\psi$=−90±10° can be exemplified.

When the LiTaO$_3$ is used as the piezoelectric material, as a cut angle of the LiTaO$_3$ in the Euler angle ($\phi$, $\theta$, $\psi$) notation, one where $\phi$, $\psi$=0±10° and $\theta$=132±15° or one where $\phi$, $\psi$=0±10° and $\theta$=−90±15° can be exemplified.

As illustrated in FIG. 1A, the electrode fingers 3a connected to one busbar 2a are disposed to extend toward a side of the busbar 2b arranged at an opposed position. The electrode fingers 3b connected to the other busbar 2b are disposed to extend toward the one busbar 2a. When viewed along an arranged direction of the electrode fingers 3a and 3b, the electrode fingers 3a connected to the one busbar 2a and the electrode fingers 3b connected to the other busbar 2b are alternately arranged.

As described above, a region where the electrode fingers 3a and 3b are alternately arranged is equivalent to an alternating region ZAB of the IDT electrode. Distal end portions of the electrode fingers 3a or 3b connected to one busbar 2a or 2b do not reach the other busbar 2b or 2a. Thus, two regions where the electrode fingers 3a and 3b are not alternated are formed on the respective busbars 2a and 2b sides viewed from the alternating region ZAB. These regions are equivalent to gap regions RB. Two regions where the respective busbars 2a and 2b are formed are also referred to as busbar regions SB. Furthermore, regions on both end sides of the alternating region ZAB and strip-shaped regions extending along the longitudinal direction to include the distal end portions of the respective electrode fingers 3a and 3b are referred to as edge regions EB. A region where the electrode fingers 3a and 3b are arranged and the alternating region ZAB, the edge regions EB, and the gap regions RB are combined is also referred to as an electrode finger region.

Figure 1B:
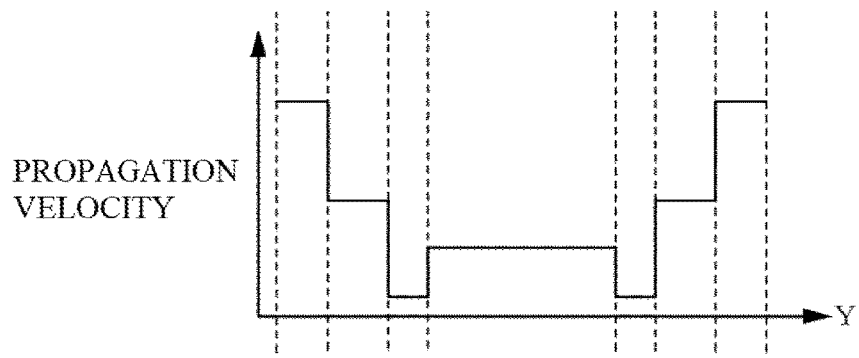
Figure 1C:
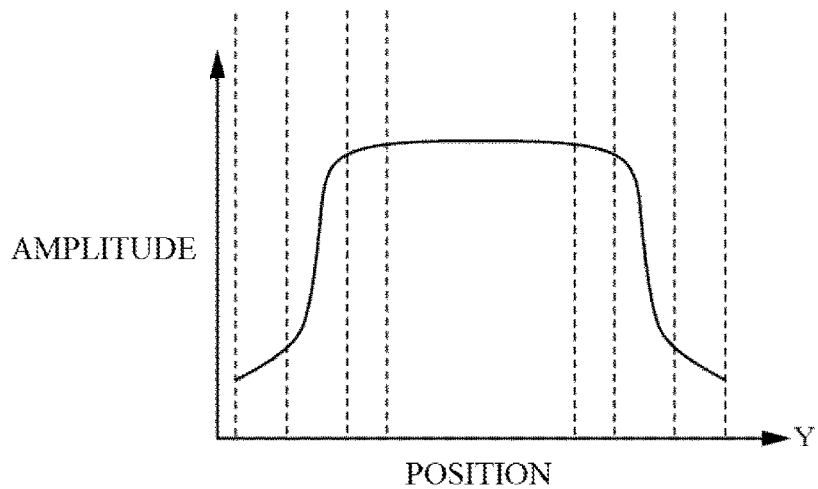

The present inventors know that it is possible to excite the SAW in the piston mode having the amplitude distribution illustrated in FIG. 1C by (i) making a SAW propagation velocity in the edge region EB slower than a SAW propagation velocity in the alternating region ZAB and (ii) making a SAW propagation velocity in the busbar region SB faster than the SAW propagation velocity in the alternating region ZAB, as illustrated in FIG. 1B, in the SAW device having the above-described configuration.

The following describes a specific exemplary configuration of the SAW device configured to excite the SAW in the piston mode by forming a distribution of the SAW propagation velocity exemplified in FIG. 1B by referring to FIG. 2A to FIG. 4C.

In the following, in SAW devices described by referring to FIG. 2A to FIG. 8C, and FIG. 9A and FIG. 9B, components common with those described using FIG. 1A are designated with identical reference numerals used in the identical drawing.

Figure 2A:
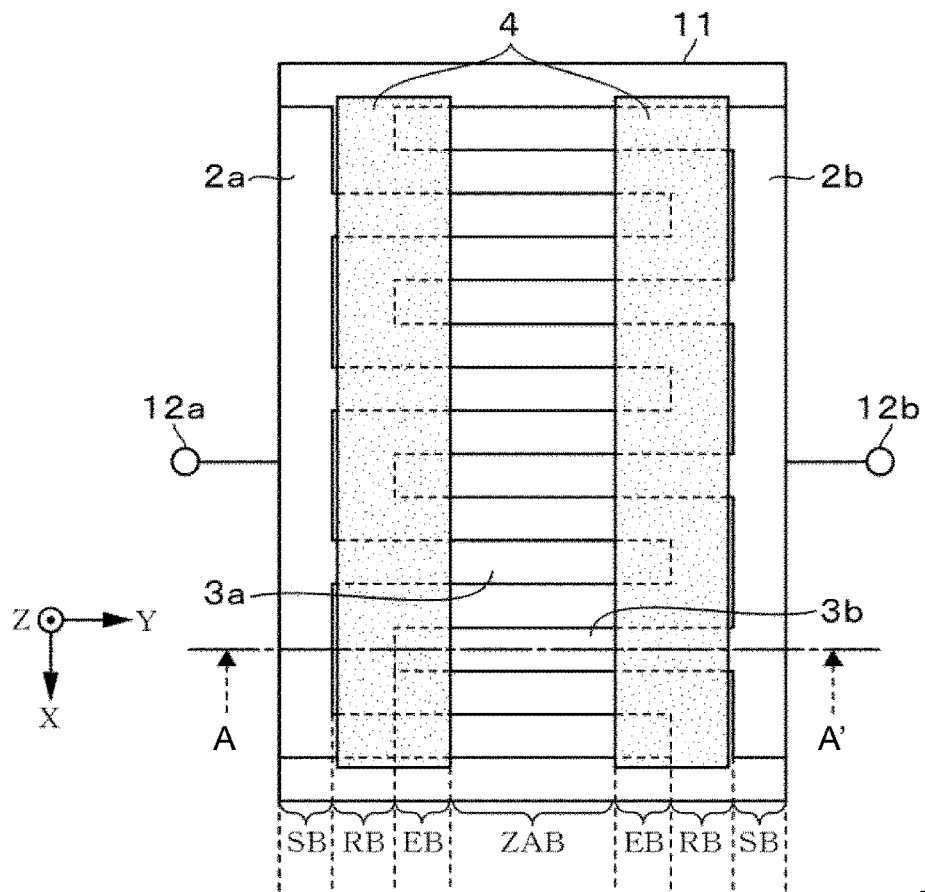
FIG. 2A to FIG. 2C are block diagrams of a SAW device according to a first embodiment.
Figure 2B:
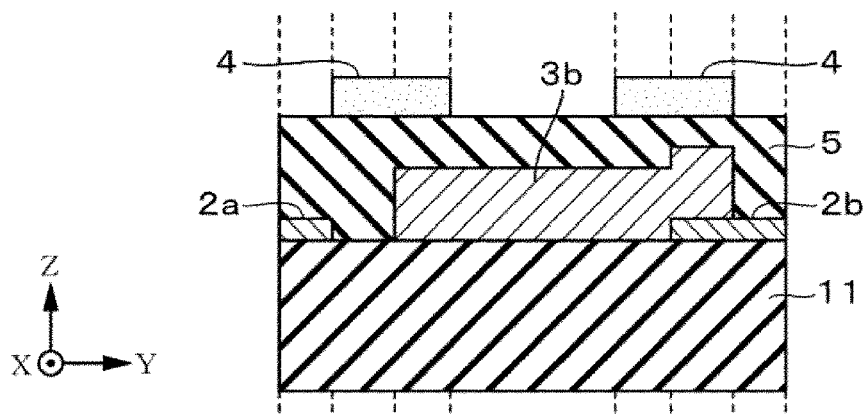

FIG. 2A illustrates a schematic plan view of the SAW device according to a first embodiment. FIG. 2B illustrates a schematic longitudinal sectional side view at a A-A' position.

As a first method for "making the SAW propagation velocity in the busbar region SB faster than the SAW propagation velocity in the alternating region ZAB" described using FIG. 1B, in the SAW device in this example, a thickness of metal films that constitute the busbars 2a and 2b is made thinner than a thickness of metal films that constitute the electrode fingers 3a and 3b (FIG. 2B).

As a second method, materials of these metal films are selected to make a density of the metal films that constitute the busbars 2a and 2b smaller than a density of the metal films that constitute the electrode fingers 3a and 3b.

A specific example of the second method will be described first. A case where, when aluminum (Al) is selected as the metal that constitutes the busbars 2a and 2b, platinum (Pt), copper (Cu), gold (Au), argentum (Ag), tungsten (W), molybdenum (Mo), cobalt (Co), iron (Fe), nickel (Ni), chrome (Cr), or tantalum (Ta) is selected as the metal that constitutes the electrode fingers 3a and 3b can be exemplified.

The metals that constitute the respective busbars 2a and 2b and electrode fingers 3a and 3b are not limited to the above-described combination example and may have another combination to make the density of the metal films that constitute the busbars 2a and 2b smaller than that of the electrode fingers 3a and 3b.

As a specific example of the first method, a case where the busbars 2a and 2b and the electrode fingers 3a and 3b formed of the metal films having different thicknesses as illustrated in FIG. 2B are separately formed can be exemplified.

A manufacturing method in the example illustrated in FIG. 2B will be described. After an aluminum metal film having a predetermined film thickness is formed on an upper surface of the piezoelectric substrate 11, patterning for the busbars 2a and 2b is performed by, for example, etching. Next, a copper metal film having a film thickness thicker than that of the aluminum metal film is formed on the upper surface of the piezoelectric substrate 11 on which patterning for the busbars 2a and 2b has been performed. Then, patterning for the electrode fingers 3a and 3b is performed by, for example, etching. This can make the film thickness of the metal films that constitute the busbars 2a and 2b thinner than that of the electrode fingers 3a and 3b.

Simultaneously employing the above-described two methods is not an essential requirement. The busbars 2a and 2b and the electrode fingers 3a and 3b, which use a common metal and are different only in film thickness, may be formed. A case where both of the busbars 2a and 2b and the electrode fingers 3a and 3b are made of the copper and the film thickness of the electrode fingers 3a and 3b is made thicker than the film thickness of the busbars 2a and 2b can be exemplified.

Alternatively, the busbars 2a and 2b and the electrode fingers 3a and 3b using metals having different densities and having a common film thickness may be formed. A case where the busbars 2a and 2b are made of the aluminum and the electrode fingers 3a and 3b are made of the copper while the film thicknesses of the electrode fingers 3a and 3b and the busbars 2a and 2b are aligned can be exemplified.

Furthermore, the SAW device in this example is configured as a Temperature Compensate (TC)-SAW device that has a temperature compensation function to compensate an influence of a temperature-frequency characteristic of the piezoelectric material that constitutes the piezoelectric substrate 11.

As illustrated in FIG. 2B, in the TC-SAW device, a dielectric film 5 is formed (hereinafter referred to as "loaded") on the upper surface of the piezoelectric substrate 11 on which the IDT electrode (the busbars 2a and 2b and the electrode fingers 3a and 3b) has been formed. To avoid complicated illustration of contents, in FIG. 2A, FIG. 3A, FIG. 4A, FIG. 5A, FIG. 6A, FIG. 7A, and FIG. 8A as plan views, illustration of the dielectric film 5 is omitted (a state where a lower surface side of the dielectric film 5 is seen through is illustrated).

As the dielectric film 5 loaded on the TC-SAW device, one having a frequency versus temperature characteristic opposite to that of the piezoelectric material of the piezoelectric substrate 11 is used. For example, when the piezoelectric material of the piezoelectric substrate 11 has a negative frequency versus temperature characteristic where an excited frequency decreases as the temperature increases, the dielectric film 5 having a positive frequency versus temperature characteristic where the frequency increases as the temperature increases is loaded. Conversely, the dielectric film 5 having the negative frequency versus temperature characteristic is loaded on the piezoelectric substrate 11 made of the piezoelectric material having the positive frequency versus temperature characteristic. Thus, an influence of a temperature variation around the SAW device can be reduced by loading the dielectric film 5 having the frequency versus temperature characteristic opposite to that of the piezoelectric substrate 11.

For example, the above-described $LiNbO_3$ has the negative frequency versus temperature characteristic. Therefore, a case where the dielectric film 5 of silicon dioxide, silicon oxynitride (it is not especially limited in a stoichiometric ratio and may be SiNO or nitrogen-doped $SiO_2$), or fluorine-doped silicon dioxide having the positive frequency versus temperature characteristic is loaded on the piezoelectric substrate 11 made of the $LiNbO_3$ can be exemplified. The dielectric film 5 made of these materials can be loaded in a method such as a Chemical Vapor Deposition (CVD) and sputtering.

Furthermore, in the SAW device in this example, as illustrated in FIG. 2A and FIG. 2B, a propagation velocity adjusting film 4 for reducing the SAW propagation velocities in the edge region EB and the gap region RB by a mass load effect is formed on a further upper surface side of the above-described dielectric film 5.

A constituent material of the propagation velocity adjusting film 4 formed to obtain the mass load effect is not especially limited, but a metal or a dielectric material is selected considering, for example, easiness for film formation and a magnitude of a specific gravity. In the SAW device in this example, titanium (Ti) that is relatively easily formed into a film and has a large specific gravity is used as the propagation velocity adjusting film 4.

Other schematic design variables for the SAW device are indicated. A distance d between center lines of the electrode fingers 3a and 3b is set at $\lambda/2$ with respect to a wavelength $\lambda$ corresponding to a design frequency of the SAW device. From the viewpoint of constituting a small SAW device, a width dimension of the gap region RB is set at around 0.1d to 2d (0.05$\lambda$ to 1$\lambda$) and preferably 0.4d to 1d (0.2$\lambda$ to 0.5$\lambda$).

Figure 2C:
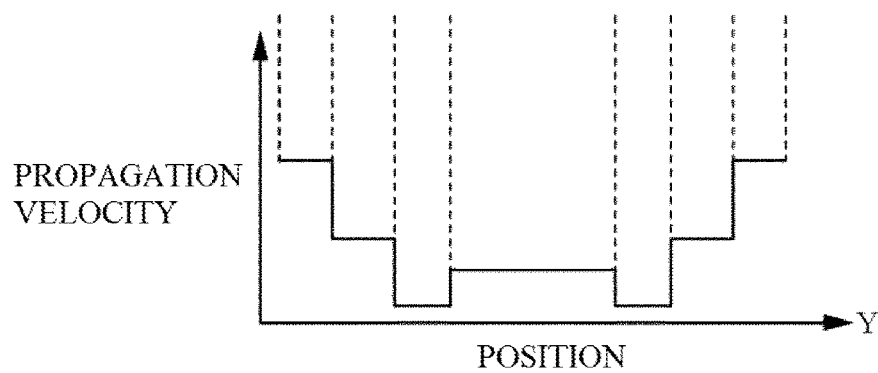

With the SAW device having the above-described configuration, the distribution diagram of the SAW propagation velocity illustrated in FIG. 2C can be formed, thus allowing the excitation of the SAW in the piston mode.

In the SAW device having the above-described configuration, when a frequency signal of the design frequency is applied, the SAW in the piston mode is excited to ensure a frequency response having a high Q-value and a few spuriouses.

The SAW device according to the embodiment provides the following effects. The SAW propagation velocity in the busbar region SB where the busbars 2a and 2b are disposed is made faster than the SAW propagation velocity in the alternating region ZAB where the electrode fingers 3a and 3b of the pair of IDT electrodes are alternately provided. Thus, the surface acoustic wave in the piston mode can be excited without adding a new region to a conventional IDT electrode.

Here, the method for "making the SAW propagation velocity in the busbar region SB faster than the SAW propagation velocity in the alternating region ZAB" is not limited to varying the film thicknesses between the metal films that constitute the above-described busbars 2a and 2b and electrode fingers 3a and 3b and selecting the materials for the metal films having different densities.

Figure 3A:
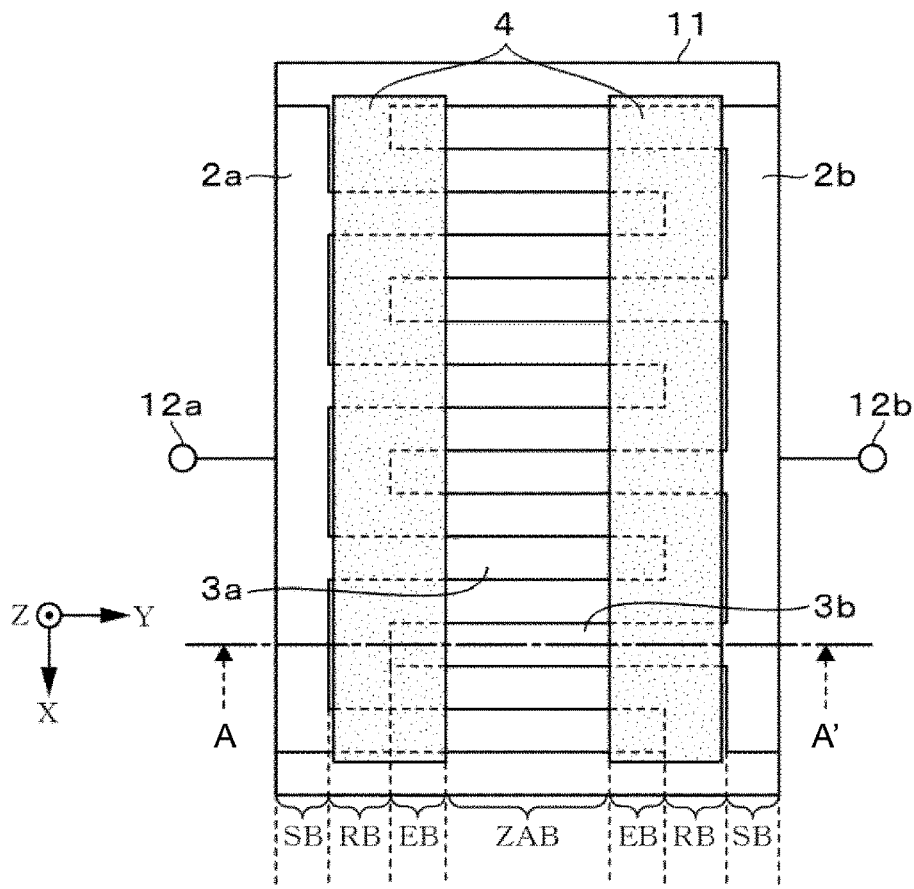
FIG. 3A to FIG. 3C are block diagrams of a SAW device according to a second embodiment.
Figure 3B:
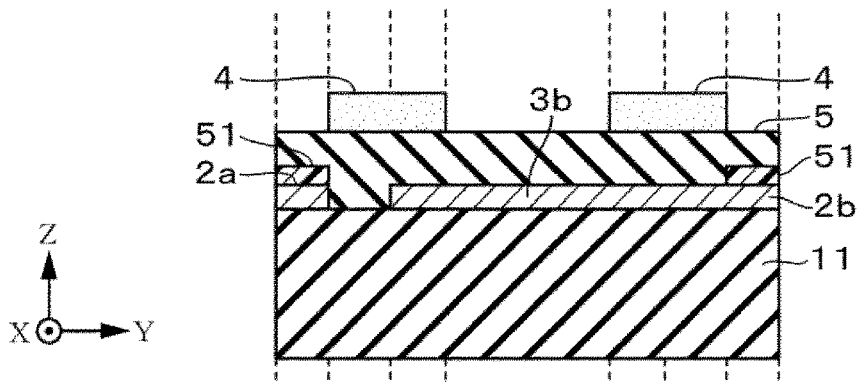
Figure 3C:
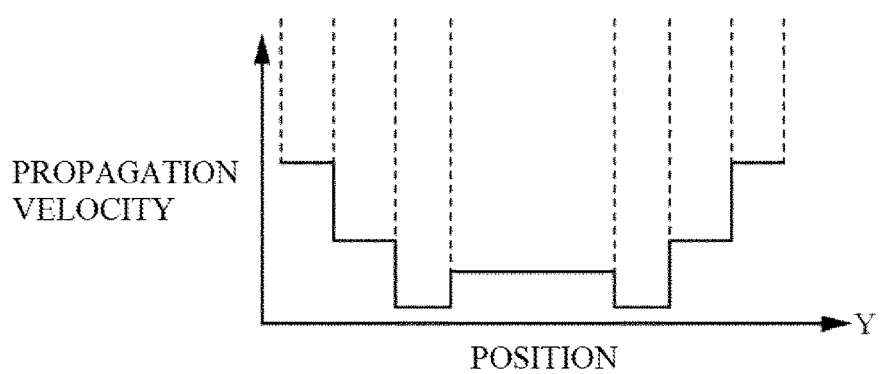

In the SAW device illustrated in FIG. 3A to FIG. 3C, the busbars 2a and 2b and the electrode fingers 3a and 3b having identical film thicknesses are formed by, for example, patterning a copper metal film formed on the piezoelectric substrate 11.

On the other hand, high-speed dielectric films 51 having a SAW propagation velocity faster than that of the dielectric film 5 made of the silicon dioxide or the fluorine-doped silicon dioxide are loaded on upper surfaces of the busbars 2a and 2b (outside the electrode finger region). It is known that, in the busbar region SB where the high-speed dielectric film 51 is loaded on the upper surface side, the SAW propagation velocity is faster than that in the other region where the dielectric film 5 is loaded.

As a dielectric material that constitutes the high-speed dielectric film 51, the aluminum nitride (AlN), aluminum oxide ($Al_2O_3$), or silicon nitride (SiN) can be exemplified.

Figure 4A:
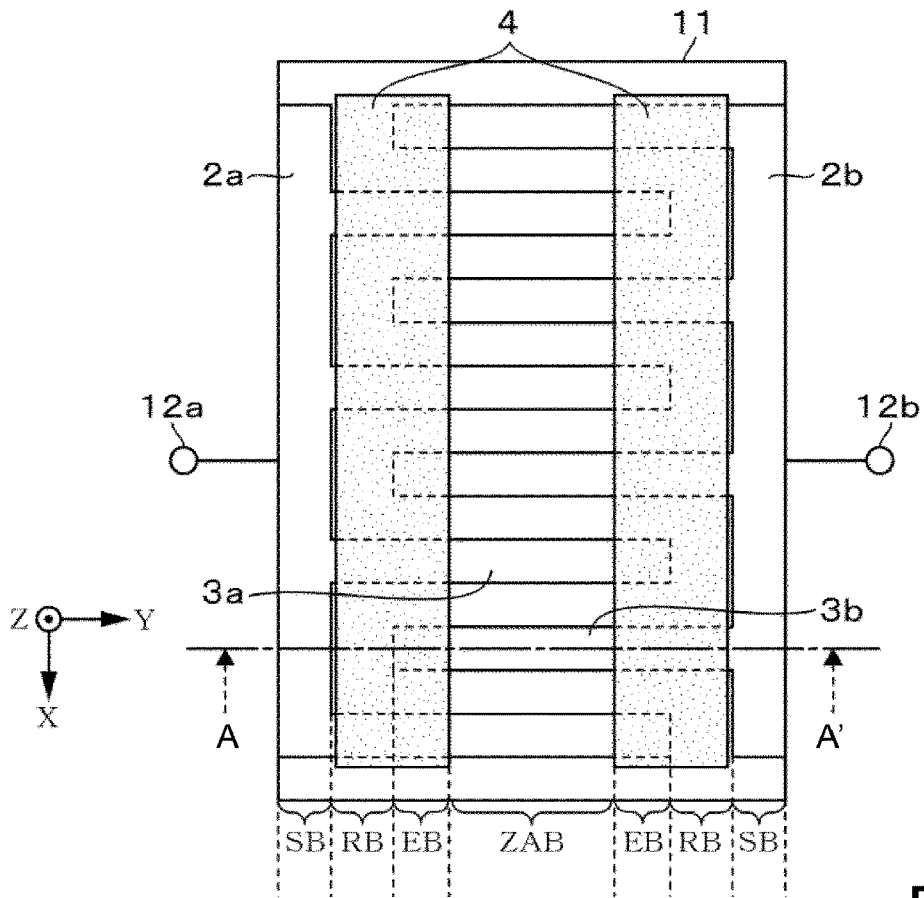
FIG. 4A to FIG. 4C are block diagrams of a SAW device according to a third embodiment.
Figure 4B:
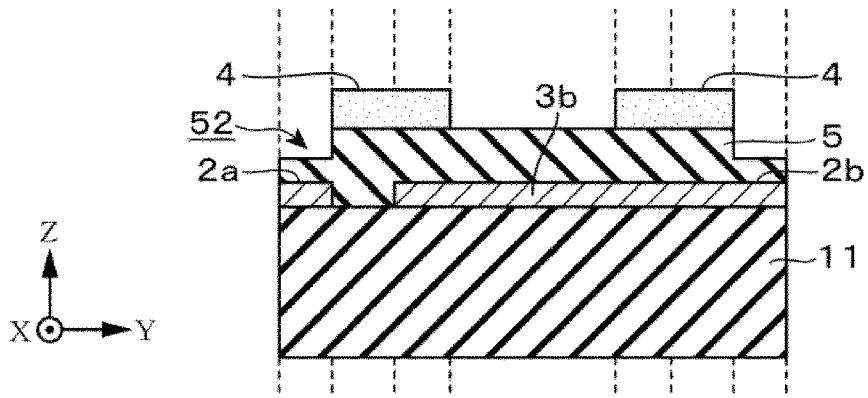
Figure 4C:
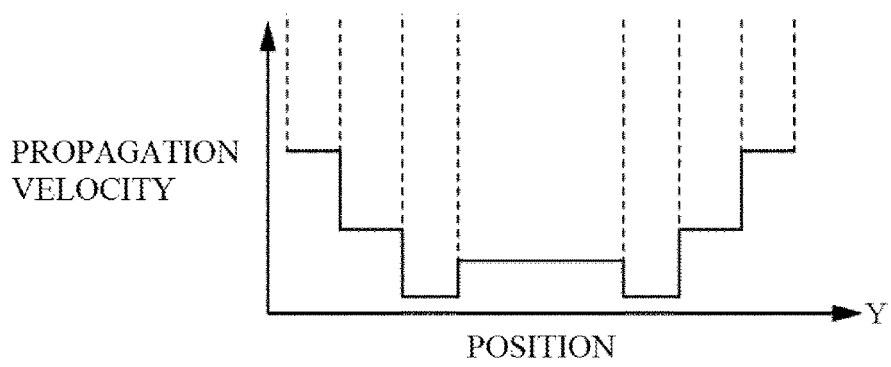

As the SAW device illustrated in FIG. 4A to FIG. 4C, it is possible to form a thin region 52 where the film thickness of the dielectric film 5 loaded on the upper surface sides of the busbars 2a and 2b (the busbar regions SB) is thinner than the film thickness of the dielectric film 5 loaded in the other region (the electrode finger region). The SAW propagation velocity increases as the film thickness of the dielectric film 5 loaded on the upper surface side becomes thin. Therefore, in the busbar region SB where the thin region 52 is formed, the SAW propagation velocity is faster than that in the other region where the dielectric film 5 thicker than that of the thin region 52 is loaded.

The thin region 52 can be formed by, for example, after loading the dielectric film 5 having a uniform film thickness on the whole surface of the SAW device, shaving a part of the dielectric film 5 on the upper surface side of the busbar region SB by etching.

The SAW propagation velocity can be made faster than that in the other region where the dielectric film 5 is loaded, by not loading the dielectric film 5 on the upper surface sides of the busbars 2a and 2b (the busbar regions SB, that is, outside the electrode finger region) (not illustrated).

The above-described various adjusting methods for the SAW propagation velocity according to the embodiment are applicable to the above-described SAW devices where the film thicknesses or the densities are different between the metal films that constitute the busbars 2a and 2b and the electrode fingers 3a and 3b described using FIG. 2A to FIG. 2C in combination.

The following describes modifications of the method to reduce the SAW propagation velocity in the edge region EB by referring to FIG. 5A to FIG. 8C.

Here, the SAW devices illustrated in such FIG. 5A to FIG. 8C include a plurality of dummy electrodes 31a and 31b. The dummy electrodes 31a and 31b are formed between the distal end portions of the plurality of electrode fingers 3a or 3b connected to one busbar 2a or 2b, and the other busbar 2b or 2a and extend from the other busbar 2b or 2a separately from these distal end portions.

The dummy electrodes 31a and 31b provide an effect to reduce occurrence of the spurious in the frequency characteristic of the SAW device. Therefore, the dummy electrodes 31a and 31b may be also formed in the respective SAW devices described using FIG. 2A to FIG. 4C.

A width dimension of dummy regions DB where the dummy electrodes 31a and 31b are formed is set at around 0.2d to 1d (0.1λ to 0.5λ).

Figure 5A:
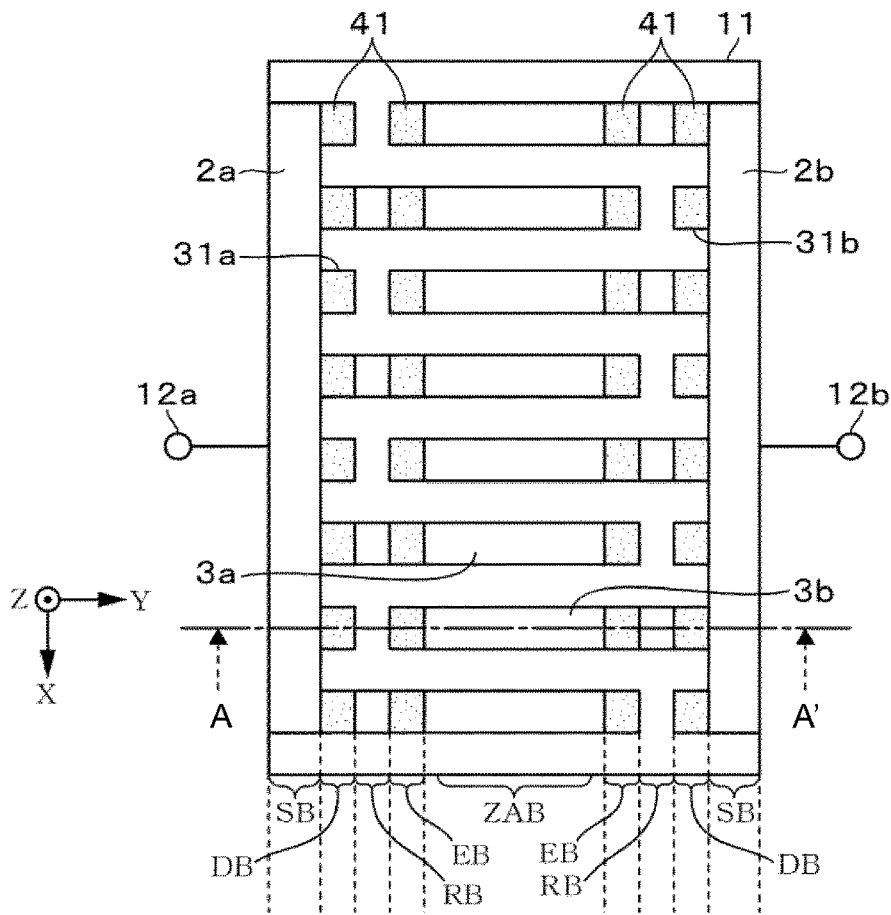
FIG. 5A to FIG. 5C are block diagrams of a SAW device according to a first modification.
Figure 5B:
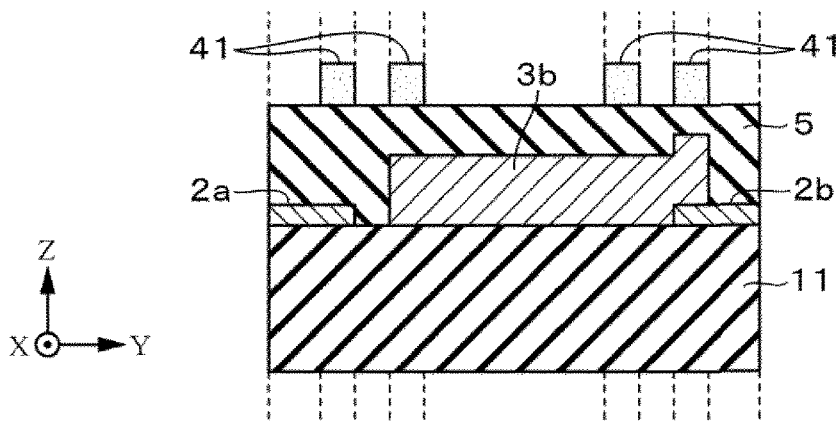
Figure 5C:
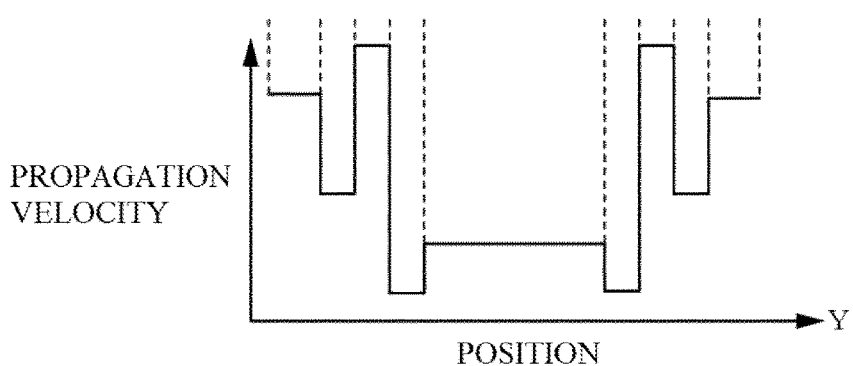

The SAW device illustrated in FIG. 5A to FIG. 5C shows an example of forming grating-shaped propagation velocity adjusting films 41 on parts included in the edge regions EB of the electrode fingers 3a and 3b and parts included in the dummy regions DB of the dummy electrodes 31a and 31b, instead of the strip-shaped propagation velocity adjusting film 4 illustrated in FIG. 4A to FIG. 4C.

Figure 6A:
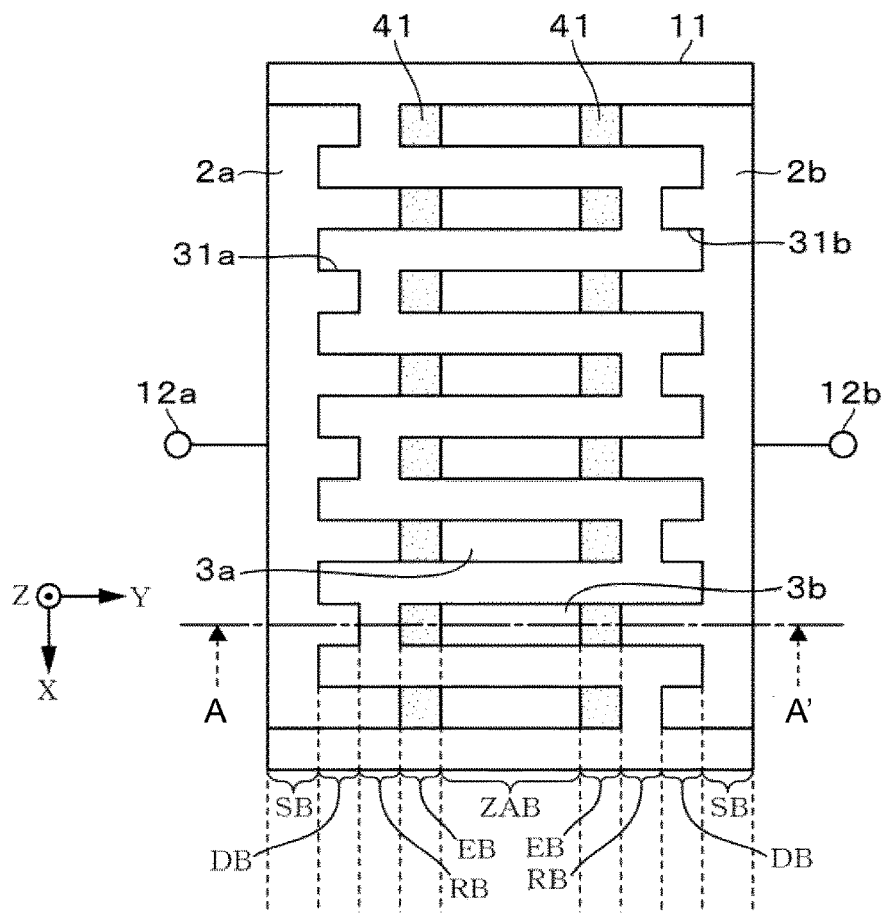
FIG. 6A to FIG. 6C are block diagrams of a SAW device according to a second modification.
Figure 6B:
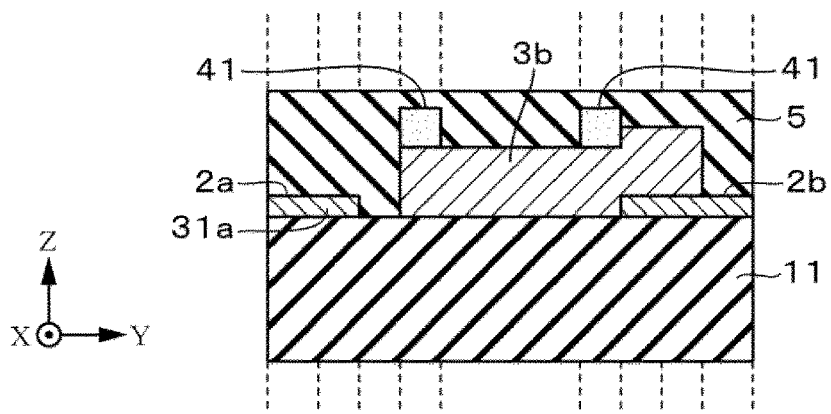
Figure 6C:
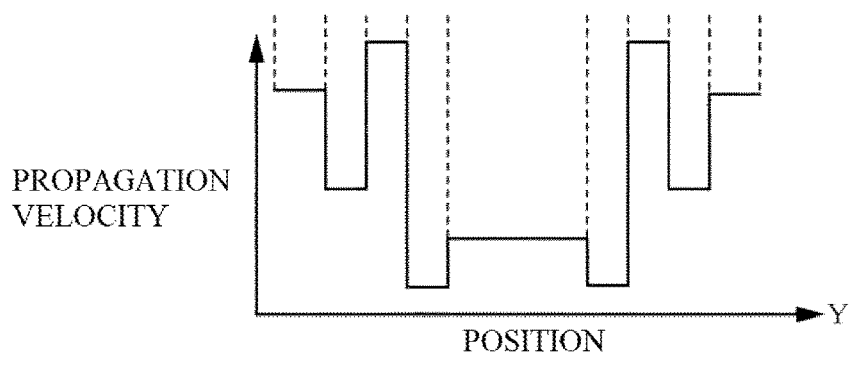

The SAW device illustrated in FIG. 6A to FIG. 6C shows an example of forming grating-shaped propagation velocity adjusting films 41 made of, for example, the copper on parts included in the edge regions EB of the electrode fingers 3a and 3b and the upper surface sides of the electrode fingers 3a and 3b, instead of the strip-shaped propagation velocity adjusting film 4 illustrated in FIG. 4A to FIG. 4C. Therefore, in the SAW device in this example, the dielectric film 5 is loaded on the upper surface side of the propagation velocity adjusting film 41.

In FIG. 6A to FIG. 6C, for convenience of illustration, the film thickness of the dielectric film 5 is illustrated as varying depending on a film formation position, but the dielectric film 5 loaded by the method such as the CVD and the sputtering is formed having an approximately constant film thickness along a stepped shape of lower side constructions (the busbars 2a and 2b, the electrode fingers 3a and 3b, and the propagation velocity adjusting film 41). Therefore, in the edge region EB on the lower side of the propagation velocity adjusting film 41, in addition to the mass load effect in accordance with the loading of the dielectric film 5, with the mass load effect in accordance with the loading of the propagation velocity adjusting film 41, the SAW propagation velocity can be made slower than that in the other region (the same applies to the exemplary SAW devices illustrated in FIG. 7A to FIG. 8C).

Figure 7A:
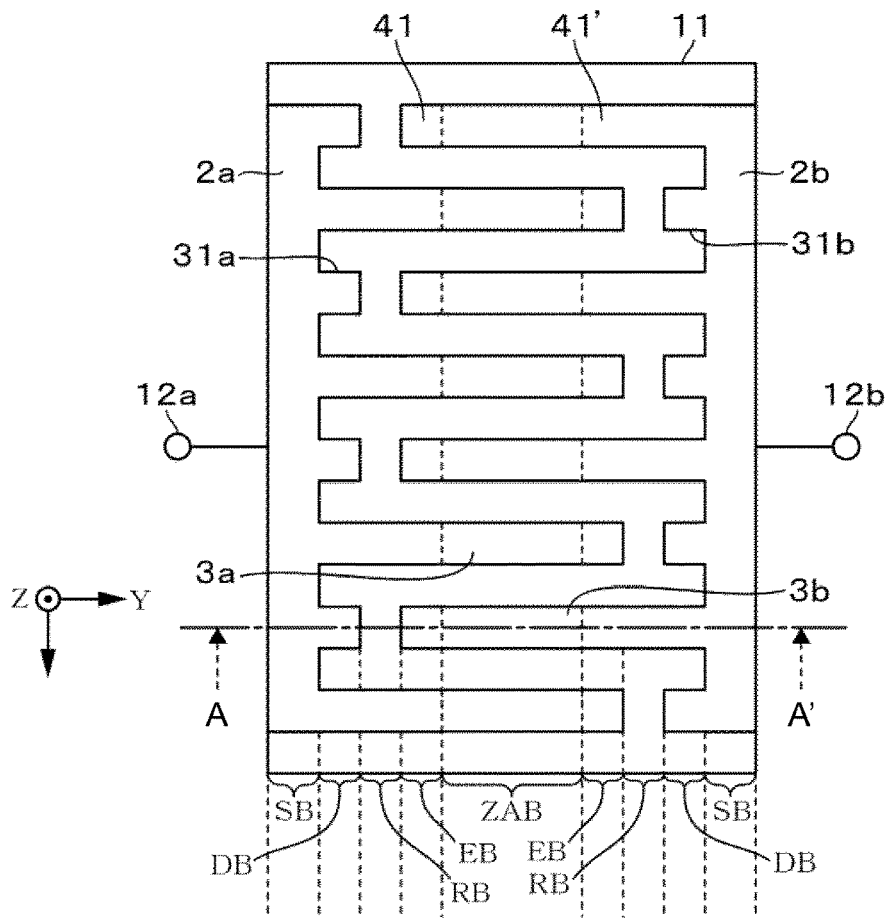
FIG. 7A to FIG. 7C are block diagrams of a SAW device according to a third modification.
Figure 7B:
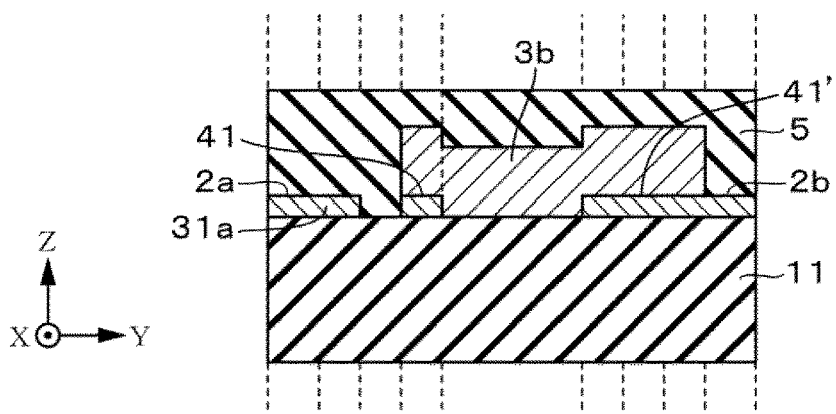
Figure 7C:
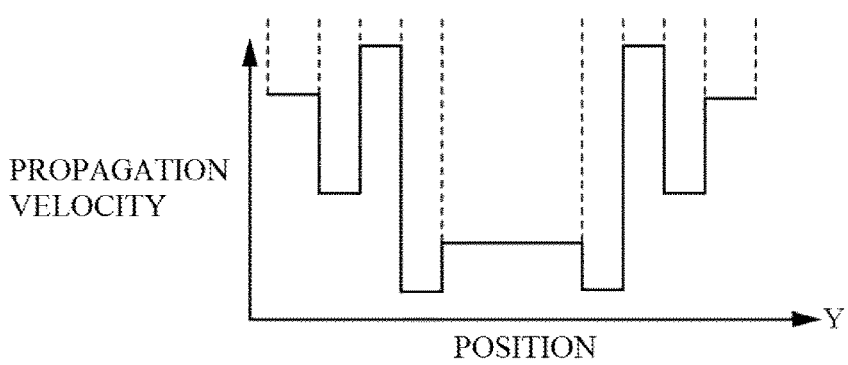

Next, the SAW device illustrated in FIG. 7A to FIG. 7C shows an example of forming propagation velocity adjusting films 41' extending into electrode finger shapes from the busbars 2a and 2b toward a region on the lower surface sides of base portions of the electrode fingers 3a and 3b and to the lower surface side of the edge region EB and forming aluminum propagation velocity adjusting films 41 on the lower surface sides of the distal end portions of the electrode fingers 3a and 3b. Loading these propagation velocity adjusting films 41' and 41 can decrease the SAW propagation velocity in the edge region EB.

Figure 8A:
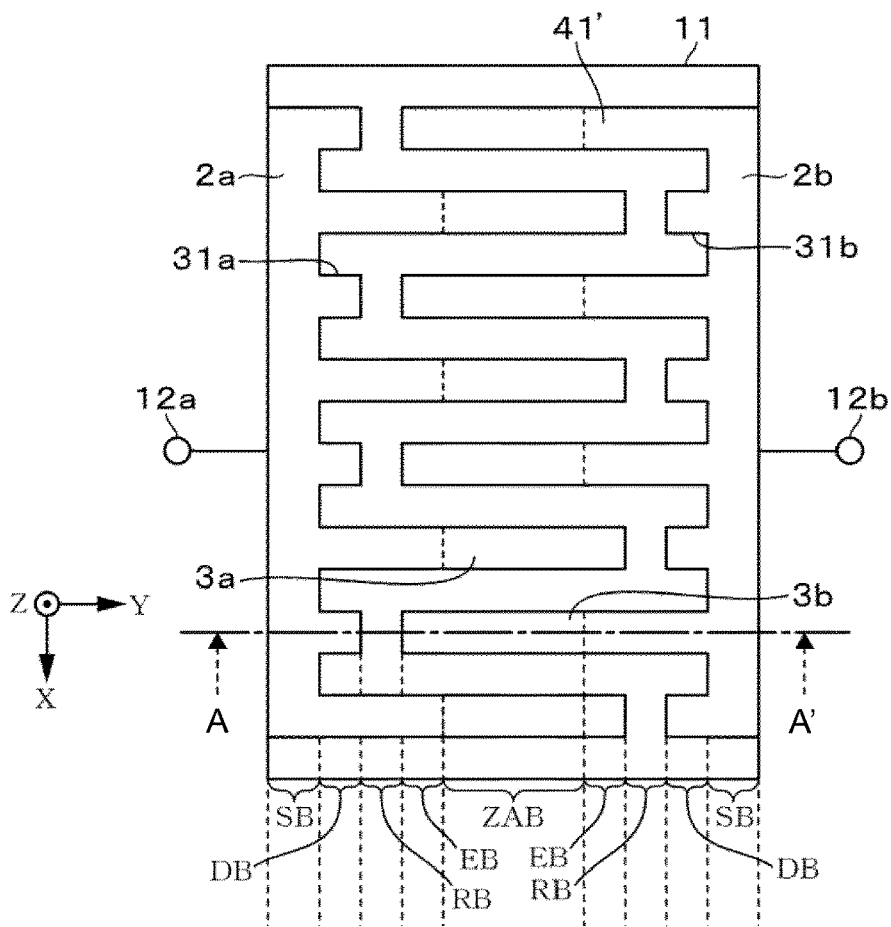
FIG. 8A to FIG. 8C are block diagrams of a SAW device according to a fourth modification.
Figure 8B:
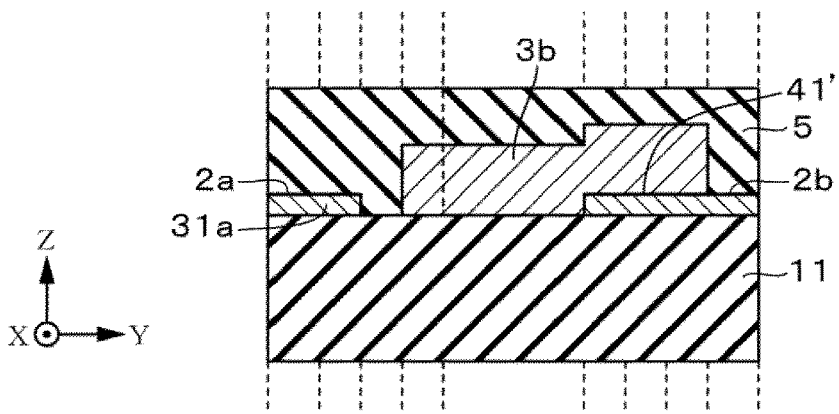
Figure 8C:
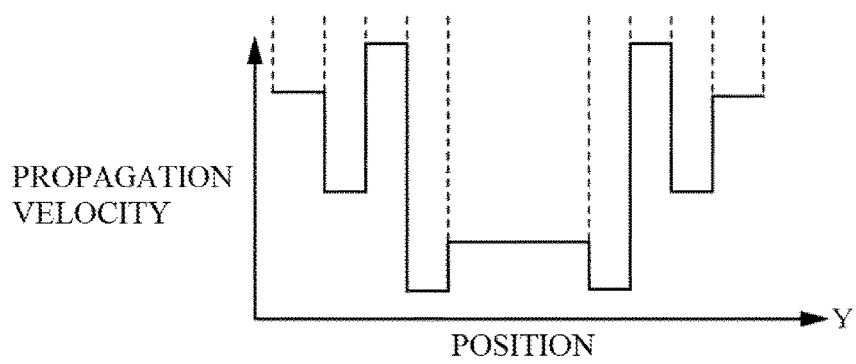

As a modification of the SAW device illustrated in FIG. 7A to FIG. 7C, as the SAW device illustrated in FIG. 8A to FIG. 8C, the formation of the propagation velocity adjusting films 41 on the lower surface sides of the distal end portions of the electrode fingers 3a and 3b may be omitted.

Furthermore, the SAW device that excites the surface acoustic wave in the piston mode is not necessarily the TC-SAW device on which the dielectric film 5 is loaded. In this case, when the propagation velocity adjusting film 4 across between the electrode fingers 3a and 3b is formed as illustrated in FIG. 2A to FIG. 3C, from the aspect of reduction in short circuit, for example, the propagation velocity adjusting film 4 may be formed of the dielectric material. At this time, as the propagation velocity adjusting films 4 and 41, the dielectric material having a slow SAW propagation velocity such as tellurium oxide may be employed.

To reduce influence of expansion and contraction in accordance with the temperature variation, a supporting substrate having a small thermal expansion rate may be stuck to a bottom surface side of the piezoelectric substrate 11. As the supporting substrate, silicon (Si), crystal ($SiO_2$), glass, diamond (C), or sapphire ($Al_2O_3$) can be exemplified. Furthermore, a dielectric material layer (for example, the silicon dioxide) or a metal layer may be formed between the supporting substrate and the piezoelectric substrate 11.

Furthermore, to cause the SAW device to have a weather resistance or to perform frequency adjustment (trimming) on the SAW device, an upper layer film may be formed on an uppermost layer of the SAW device. The upper layer film is formed on the upper layer side with respect to the IDT electrode (the busbars 2a and 2b, the electrode fingers 3a and 3b, and the dummy electrodes 31a and 31b), the propagation velocity adjusting films 4, 41, and 41', and the dielectric film 5. The upper layer film can be made of, for example, the silicon nitride.

The above-described SAW device can be used as an electronic component in the single SAW device illustrated in FIG. 2A to FIG. 8C. The piezoelectric substrate 11 may be expanded in the longitudinal direction to dispose grating reflectors ahead and behind the IDT electrode.

Furthermore, this SAW device is also applicable to an acoustic wave resonator or an acoustic wave filter where a plurality of IDT electrodes are disposed on a common piezoelectric substrate 11.

The SAW device in this example can be used for any device having a filter function including a filter, a duplexer, and a quadplexer. This device can be incorporated in a power amplifier duplexer module (Power Amp Integrated Duplexer) referred to as, for example, a PAMiD, a PAiD, and a PAD and a diversity reception module (Diversity Front End Module) referred to as, for example, a DiFEM.

Working Example

The frequency characteristic of the SAW device corresponding to the distribution of the SAW propagation velocity was confirmed by simulation.

A. Simulation Condition

Working Example

Figure 10:
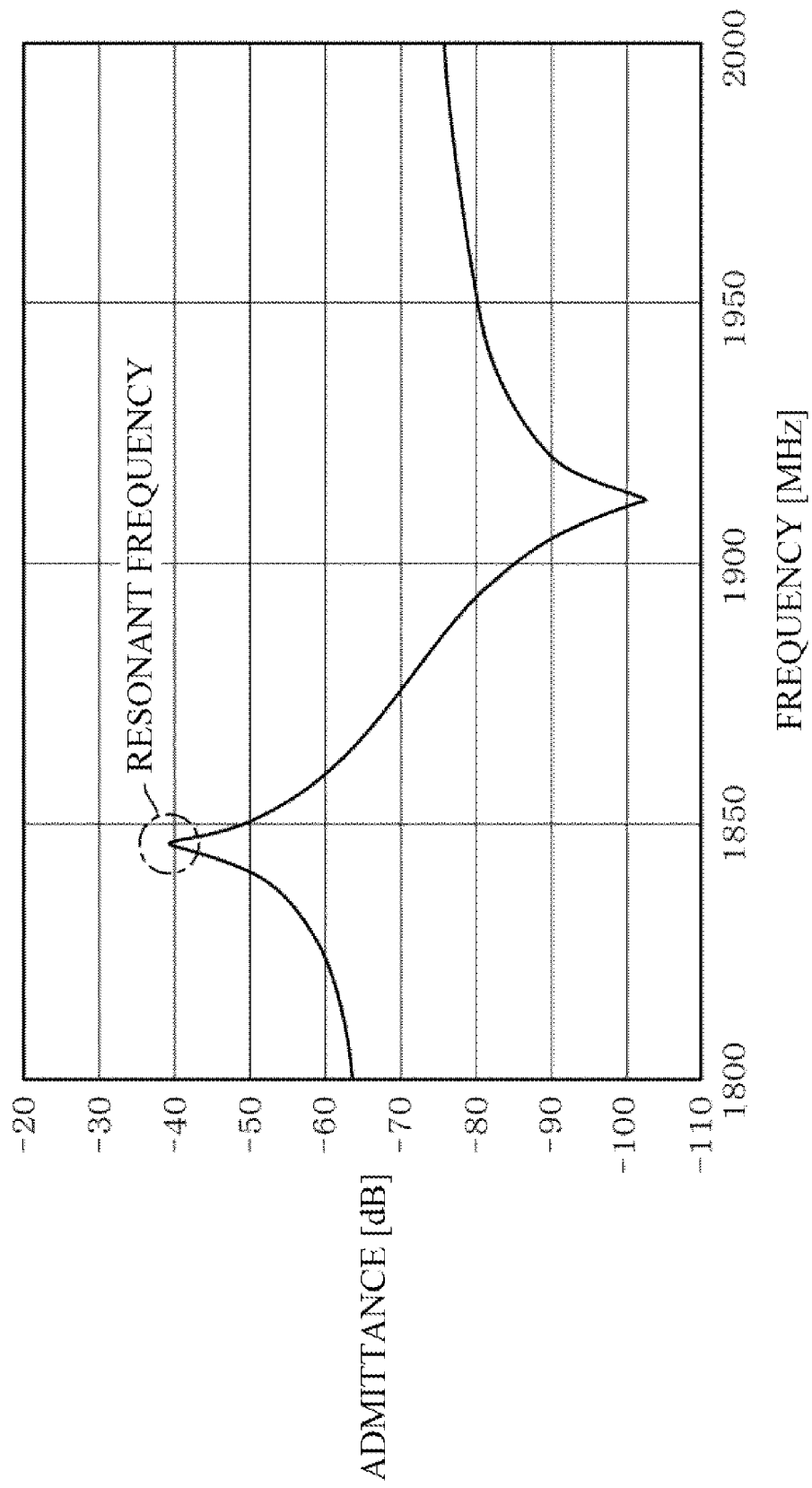
FIG. 10 is a frequency-admittance characteristic diagram according to the SAW device in a working example.

A frequency-admittance characteristic was examined by making a simulation model of the SAW device having the SAW propagation velocity distribution illustrated in FIG. 2C. FIG. 10 illustrates its result.

Comparative Example

Figure 9A:
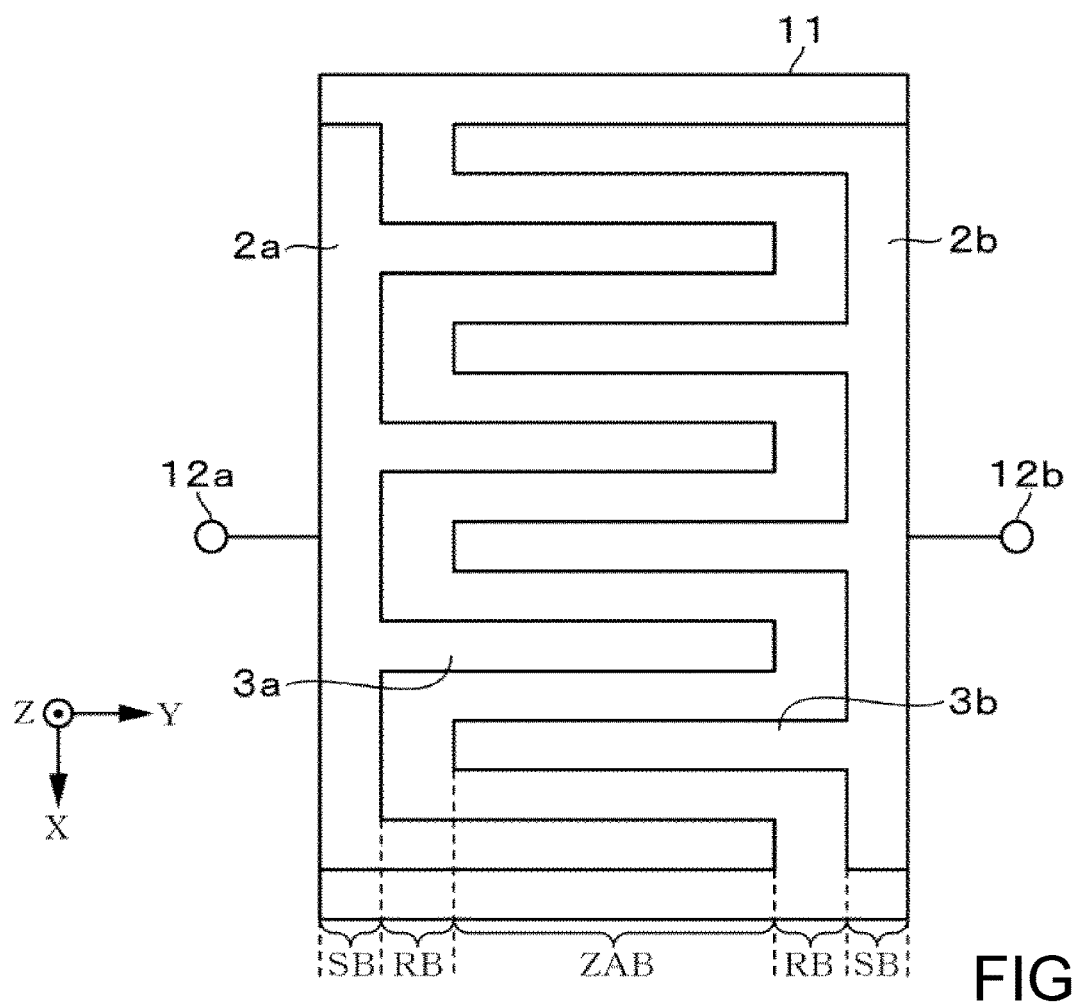
FIG. 9A and FIG. 9B are block diagrams of a SAW device in a comparative example.
Figure 9B:
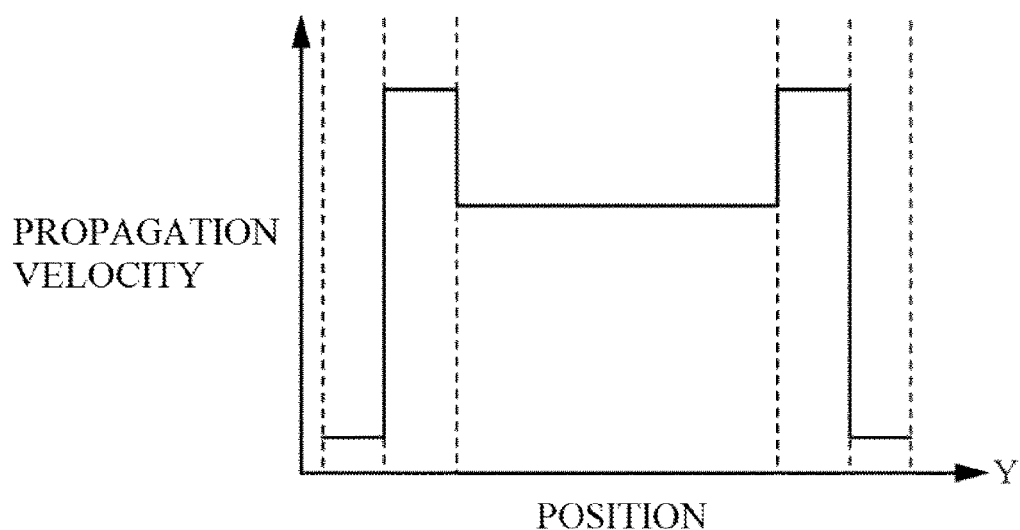
Figure 11:
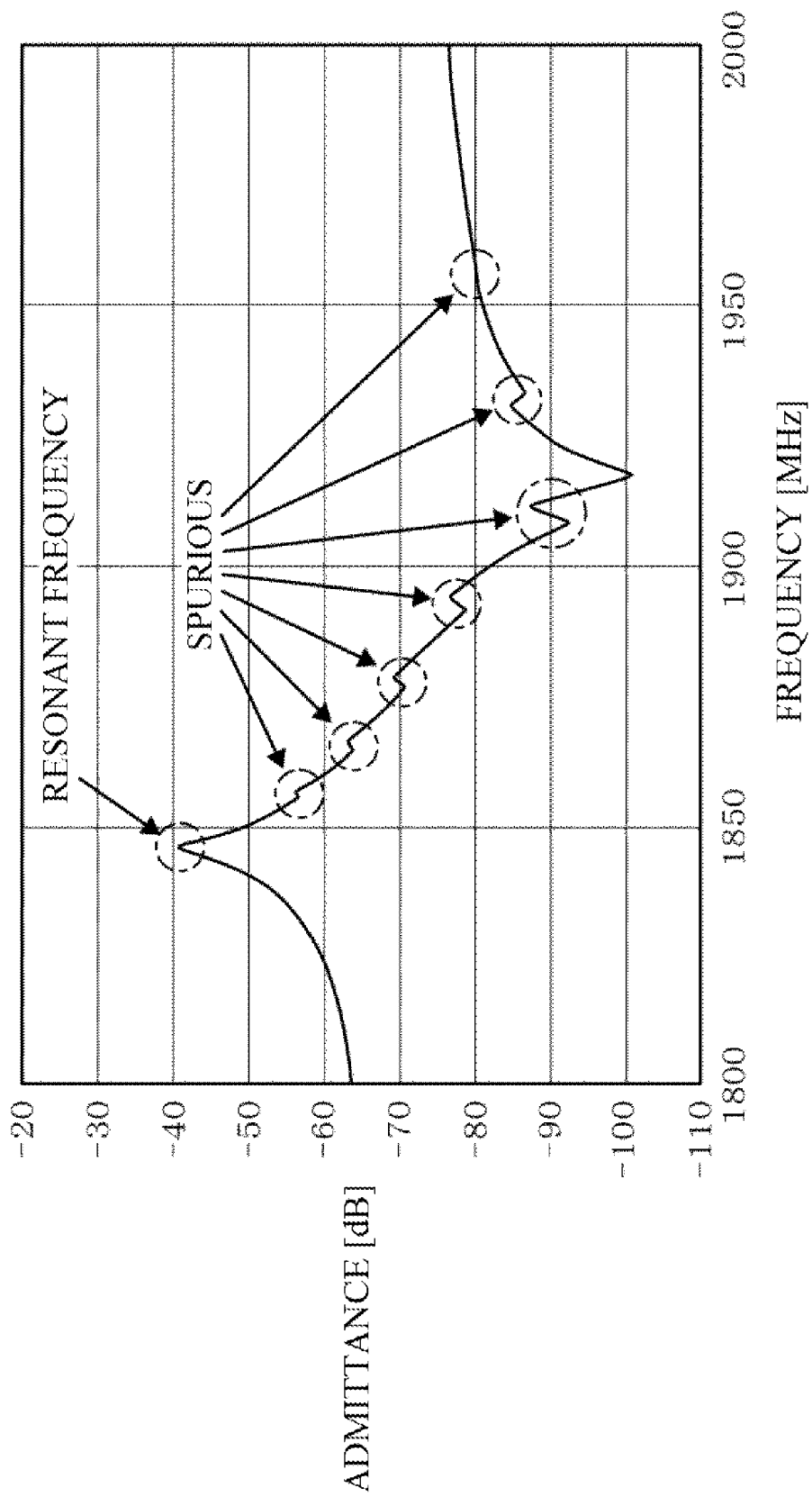
FIG. 11 is a frequency-admittance characteristic diagram according to the SAW device in the comparative example.

As illustrated in FIGS. 9A and 9B, a frequency-admittance characteristic was examined by making a simulation model of the SAW device having a SAW propagation velocity distribution where the SAW propagation velocity in the busbar region SB is slower than the SAW propagation velocity in the alternating region ZAB. FIG. 11 illustrates its result.

B. Simulation Result

With the simulation result in the working example illustrated in FIG. 10, it could be confirmed that a resonance point and an anti-resonance point of the SAW was confirmed, thus having a characteristic available as the SAW device. The spurious caused by a higher order transverse mode was not observed, thus ensuring configuration of the SAW device having a small insertion loss.

Meanwhile, as illustrated in FIG. 11, in the SAW device according to the comparative example, it can be seen that multiple spuriouses caused by the higher order transverse mode were observed and the insertion loss is larger than that in the SAW device in the working example.

Thus, also from comparison between the working example and the comparative example, it was confirmed that the SAW device according to the working example including the propagation velocity adjusting film 4 has a good characteristic having a few spuriouses.

The above-described surface acoustic wave device may have the following configurations.

(a) A propagation velocity adjusting film is provided in the edge region to make the propagation velocity of the surface acoustic wave slower than the propagation velocity of the surface acoustic wave in the alternating region. Alternatively, the electrode finger positioned in the edge region includes a widened portion to make the propagation velocity of the surface acoustic wave slower than the propagation velocity of the surface acoustic wave in the alternating region.

(b) a thickness of a metal film that constitutes the busbar is thinner than a thickness of a metal film that constitutes the electrode finger to make the propagation velocity of the surface acoustic wave in the busbar region faster than the propagation velocity of the surface acoustic wave in the alternating region.

(c) a density of a metal film that constitutes the busbar is smaller than a density of a metal film that constitutes the electrode finger to make the propagation velocity of the surface acoustic wave in the busbar region faster than the propagation velocity of the surface acoustic wave in the alternating region.

(d) A dielectric film is provided on an upper layer side with respect to the interdigital transducer electrode. The dielectric film has a temperature-frequency characteristic whose frequency varies in a direction opposite to a direction of a temperature-frequency characteristic of the piezoelectric substrate.

(e) a thickness of the dielectric film provided in the busbar region is thinner than a thickness of the dielectric film provided in an electrode finger region where the electrode finger is arranged to make the propagation velocity of the surface acoustic wave in the busbar region faster than the propagation velocity of the surface acoustic wave in the alternating region. Alternatively, the dielectric film is provided in an electrode finger region where the electrode finger is arranged, and the dielectric film is not provided in the busbar region to make the propagation velocity of the surface acoustic wave in the busbar region faster than the propagation velocity of the surface acoustic wave in the alternating region.

(f) the dielectric film provided in the busbar region is configured from a dielectric material having a propagation velocity of the surface acoustic wave faster than a propagation velocity of the surface acoustic wave of the dielectric film provided in an electrode finger region where the electrode finger is arranged to make the propagation velocity of the surface acoustic wave in the busbar region faster than the propagation velocity of the surface acoustic wave in the alternating region.

(g) In (d) to (f), the piezoelectric substrate is made of $LiNbO_3$ or $LiTaO_3$, and the dielectric film is made of silicon oxide, silicon oxynitride, or fluorine-doped silicon oxide.

(h) For each of the pair of busbars, a plurality of dummy electrodes is provided between the distal end portions of the plurality of electrode fingers connected to the one busbar, and the other busbar, and the plurality of dummy electrodes extends from the other busbar separately from the distal end portions. A propagation velocity adjusting film is provided to decrease the propagation velocity of the surface acoustic wave, and the propagation velocity adjusting film is provided in a dummy region as a region where the dummy electrode is provided.

(i) With respect to a distance d between center lines of adjoiningly arranged electrode fingers, a width between an end portion of the alternating region and the busbar when viewed along an extending direction of the electrode fingers is in a range of 0.1d to 2d.

(j) An upper layer film is provided on an uppermost layer of the surface acoustic wave device to cause the surface acoustic wave device to have a weather resistance or to perform a frequency adjustment. The upper layer film is made of silicon nitride.

According to the embodiment, the propagation velocity of the surface acoustic wave in the edge region is made slower than the propagation velocity of the surface acoustic wave in the alternating region, and the propagation velocity of the surface acoustic wave in the busbar region where the busbar is disposed is made faster than the propagation velocity of surface acoustic wave in the alternating region where the electrode fingers of the pair of IDT electrode are alternately provided. Thus, the surface acoustic wave in the piston mode can be excited without providing a long gap length dimension to the conventional IDT electrode.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A surface acoustic wave device, comprising:
a piezoelectric substrate; and
a pair of interdigital transducer electrodes, including:
a pair of busbars, provided on the piezoelectric substrate, and
a plurality of electrode fingers, mutually extending into a comb shape from the respective busbar towards the opposed busbar,
wherein the pair of interdigital transducer electrodes includes an alternating region as a region where the electrode fingers connected to one busbar and the electrode fingers connected to the other busbar are alternately provided, when viewed along an arranged direction of the plurality of electrode fingers,
wherein when a region on an end portion side of the alternating region and a region including distal end portions of the plurality of electrode fingers is referred to as an edge region, a propagation velocity of a surface acoustic wave in the edge region is slower than a propagation velocity of a surface acoustic wave in the alternating region, and
a propagation velocity of a surface acoustic wave in a busbar region as a region where the pair of busbars are disposed is faster than the propagation velocity of the surface acoustic wave in the alternating region;
wherein a thickness of a metal film that constitutes the pair of busbars is thinner than a thickness of a metal film that constitutes the electrode finger to make the propagation velocity of the surface acoustic wave in the busbar region faster than the propagation velocity of the surface acoustic wave in the alternating region.

2. The surface acoustic wave device according to claim 1, wherein
a propagation velocity adjusting film is provided in the edge region to make the propagation velocity of the surface acoustic wave slower than the propagation velocity of the surface acoustic wave in the alternating region.

3. The surface acoustic wave device according to claim 1, wherein
the electrode finger positioned in the edge region includes a widened portion to make the propagation velocity of the surface acoustic wave slower than the propagation velocity of the surface acoustic wave in the alternating region.

4. The surface acoustic wave device according to claim 1, wherein
with respect to a distance d between center lines of adjoiningly arranged electrode fingers, a width between an end portion of the alternating region and the busbar when viewed along an extending direction of the electrode fingers is in a range of 0.1d to 2d.

5. The surface acoustic wave device according to claim 1, wherein
a density of a metal film that constitutes the pair of busbars is smaller than a density of a metal film that constitutes the electrode finger to make the propagation velocity of the surface acoustic wave in the busbar region faster than the propagation velocity of the surface acoustic wave in the alternating region.

6. The surface acoustic wave device according to claim 1, wherein
a dielectric film is provided on an upper layer side with respect to the interdigital transducer electrode, and
the dielectric film has a temperature-frequency characteristic whose frequency varies in a direction opposite to a direction of a temperature-frequency characteristic of the piezoelectric substrate.

7. The surface acoustic wave device according to claim 6, wherein
a thickness of the dielectric film provided in the busbar region is thinner than a thickness of the dielectric film provided in an electrode finger region where the plurality of electrode fingers are arranged to make the propagation velocity of the surface acoustic wave in the busbar region faster than the propagation velocity of the surface acoustic wave in the alternating region.

8. The surface acoustic wave device according to claim 6, wherein
the dielectric film provided in the busbar region is configured from a dielectric material having a propagation velocity of the surface acoustic wave faster than a propagation velocity of the surface acoustic wave of the dielectric film provided in an electrode finger region where the electrode finger is arranged to make the propagation velocity of the surface acoustic wave in the busbar region faster than the propagation velocity of the surface acoustic wave in the alternating region.

9. The surface acoustic wave device according to claim 6, wherein
the dielectric film is provided in an electrode finger region where the electrode finger is arranged, and the dielectric film is not provided in the busbar region to make the propagation velocity of the surface acoustic wave in the busbar region faster than the propagation velocity of the surface acoustic wave in the alternating region.

10. The surface acoustic wave device according to claim 6, wherein
the piezoelectric substrate is made of $LiNbO_3$ or $LiTaO_3$, and
the dielectric film is made of silicon oxide, silicon oxynitride, or fluorine-doped silicon oxide.

11. The surface acoustic wave device according to claim 1, wherein
for each of the pair of busbars, a plurality of dummy electrodes is provided between the distal end portions of the plurality of electrode fingers connected to the one busbar, and the other busbar, and
the plurality of dummy electrodes extends from the other busbar separately from the distal end portions.

12. The surface acoustic wave device according to claim 11, wherein
a propagation velocity adjusting film is provided to decrease the propagation velocity of the surface acoustic wave, and the propagation velocity adjusting film is provided in a dummy region as a region where the dummy electrode is provided.

13. The surface acoustic wave device according to claim 1, further comprising:
an upper layer film, being provided on an uppermost layer of the surface acoustic wave device to cause the surface acoustic wave device to have a weather resistance or to perform a frequency adjustment.

14. The surface acoustic wave device according to claim 13, wherein the upper layer film is made of silicon nitride.

* * * * *